(12) United States Patent
Maruyama et al.

(10) Patent No.: US 7,214,872 B2
(45) Date of Patent: May 8, 2007

(54) PHOTOVOLTAIC ELEMENT AND PHOTOVOLTAIC DEVICE

(75) Inventors: Eiji Maruyama, Katano (JP); Toshiaki Baba, Kobe (JP)

(73) Assignee: Sanyo Electric Co., Ltd, Osaka (JP)

( * ) Notice: Subject to any disclaimer, the term of this patent is extended or adjusted under 35 U.S.C. 154(b) by 442 days.

(21) Appl. No.: 10/245,087

(22) Filed: Sep. 17, 2002

(65) Prior Publication Data

US 2003/0062081 A1 Apr. 3, 2003

(30) Foreign Application Priority Data

Sep. 28, 2001 (JP) .............................. 2001-300462
Mar. 19, 2002 (JP) .............................. 2002-076978
Aug. 19, 2002 (JP) .............................. 2002-237965

(51) Int. Cl.
*H01L 31/00* (2006.01)

(52) U.S. Cl. ...................................... 136/258; 136/256

(58) Field of Classification Search ........ 136/243–265; 438/57–98
See application file for complete search history.

(56) References Cited

U.S. PATENT DOCUMENTS

| | | | | |
|---|---|---|---|---|
| 4,663,188 A | | 5/1987 | Kane | 427/74 |
| 4,732,621 A | * | 3/1988 | Murata et al. | 136/256 |
| 5,344,498 A | * | 9/1994 | Inoue | 136/251 |
| 5,413,959 A | | 5/1995 | Yamamoto et al. | 437/174 |
| 6,271,053 B1 | * | 8/2001 | Kondo | 438/57 |

FOREIGN PATENT DOCUMENTS

| | | |
|---|---|---|
| CN | 1191395 A | 8/1998 |
| EP | 461 908 | 12/1991 |
| EP | 0 860 885 | 8/1998 |

OTHER PUBLICATIONS

J.S. Kim et al, "Characterisation of the properties of surface-treated indium-tin oxide thin films." Synthetic Metals. 101 (1999) 111-112.*

(Continued)

*Primary Examiner*—Nam Nguyen
*Assistant Examiner*—Jeffrey Barton
(74) *Attorney, Agent, or Firm*—Darby & Darby

(57) ABSTRACT

An ITO film as a transparent conductive film is formed on a semiconductor layer comprising an amorphous semiconductor or a microcrystalline semiconductor, a comb-like collecting electrode is formed on the ITO film, and a cover glass containing alkaline ions is placed on the ITO film and collecting electrode with a resin film made of EVA between them. The (222) plane orientation degree of the ITO film (transparent conductive film) is not less than 1.0, preferably not less than 1.2 and not more than 2.6, and more preferably not less than 1.4 and not more than 2.5. Alternatively, the transparent conductive film has an orientation of (321) planes on the boundary side with respect to the semiconductor layer and mainly an orientation of (222) planes in the remaining portion. When the total thickness of the ITO film is 100 nm, the (321)/(222) diffraction strength ratio in a 10 nm-thick portion on the semiconductor layer side is not less than 0.5 and not more than 2.5.

6 Claims, 23 Drawing Sheets

OTHER PUBLICATIONS

C. Nunes de Carvalho et al, "Effect of substrate temperature on the surface structure, composition and morphology of indium-tin oxide films." Surface and Coatings Technology. 124 (2000) 70-75.*

International Centre for Diffraction Data, Card 06-0416, In2O3 powder diffraction data.*

*Origin of Characteristic Grain-Subgrain Structure of Tin-Doped Indium Oxide Films*, Masayuki Kamei et al. (vol. 259, No. 1, Apr. 1, 1995, pp. 38-45.

*Oxidation Dependent Crystallization Behaviour of IO and ITO Thin Films Deposited By Reactive Thermal Deposition Technique*, P. Thilakan et al. (vol. 55, No. 3, Sep. 4, 1998, pp. 195-200).

*Properties of Indium Tin Oxide (ITO) Films Prepared By R.F. Reactive Magnetron Sputtering At Different Pressures*, L. Meng et al. (vol. 303, No. 1-2, Jul. 15, 1997, pp. 151-155).

*Variations in Microstructure and Composition of Indium Tin Oxide Film With the Deposition Technique*, M. Rottmann et al. (vol. 31, 1996, pp. 6495-6500).

Shigesato et al., The Structural Changes of Indium-Tin Oxide and a-$Wo_3$ Films by Introducing Water to the Deposition Processes, Apr. 1991, *Japanese Journal of Applied Physics* 30(4): 814-819.

* cited by examiner

100nm

PHOTOVOLTAIC ELEMENT AND PHOTOVOLTAIC DEVICE

BACKGROUND OF THE INVENTION

The present invention relates to a photovoltaic element, such as a solar cell and an optical sensor, with a structure comprising a transparent conductive film deposited on a semiconductor layer like a pin junction, and also relates to a photovoltaic device using the photovoltaic element.

In recent years, the introduction of a solar power generation system that is installed on the roof of a house has been promoted rapidly. A solar cell for use in the solar power generation system utilizes, for example, a HIT (heterojunction with intrinsic thin-layer) type photovoltaic element which is produced by stacking i-type and p-type amorphous semiconductor layers and a transparent conductive film made of an Sn-doped indium oxide film (hereinafter referred to as an ITO (Indium Tin Oxide) film) successively on an n-type crystalline silicon wafer and forming a collecting electrode on the transparent conductive film, or a photovoltaic element which is obtained by forming a back electrode, n-type, i-type and p-type amorphous semiconductor layers, a transparent conductive film made of an ITO film, and a collecting electrode in this order on a substrate having an insulating surface such as glass plate, plastic plate, or metal plate with an insulating film formed on the surface thereof.

Since a solar cell module using such a photovoltaic element is generally mounted outdoors, it needs to have high environment resistance reliability. Hence, conventionally, when a photovoltaic element is incorporated as a product into a module, a cover glass is often used for the purpose of protecting the photovoltaic element, and thereby ensuring environmental resistance of the module.

As the cover glass, in general, inexpensive soda glass is used. However, under conditions such as a high humidity condition, alkaline ions such as Na, Li and K contained in the soda glass may be diffused into the transparent conductive film and amorphous semiconductor layers, and may give a vicious influence on the transparent conductive film and amorphous semiconductor layers. If alkaline ions are diffused into the transparent conductive film, the conductivity decreases, and abnormalities in the refractive index, etc. occur. If alkaline ions are diffused into the amorphous semiconductor layers, a diffusion potential change occurs, and there arises a problem of deterioration of the characteristics of the photovoltaic element.

It is therefore desirable that the photovoltaic element itself should have excellent environment resistance, particularly excellent resistance against alkaline ions, and there has been demand for an improved transparent conductive film. Moreover, the transparent conductive film of the photovoltaic element is required to have high light transmittance and low electrical resistance for high efficiency. In general, in order to achieve high light transmittance and low electrical resistance, it is necessary to improve the crystallinity of the transparent conductive film. In this case, however, in the ITO that is a polycrystalline substance, the crystal grains become larger, and accordingly the influence of the crystal grain boundaries increases. Thus, there are possibilities of promotion of diffusion of alkaline ions through the grain boundaries as the path and a decrease in the environment resistance reliability.

As a method for preventing the diffusion of alkaline ions, it is considered to provide a diffusion preventing layer (for example, $SiO_2$ layer) against the alkaline ions, between the cover glass and the transparent conductive film. However, this method has problems that the additional step of forming the diffusion preventing layer and extra cost are required.

BRIEF SUMMARY OF THE INVENTION

An object of the present invention is to provide a photovoltaic element capable of preventing diffusion of alkaline ions without decreasing the energy conversion efficiency by controlling the (222) plane orientation degree of a transparent conductive film made of an indium oxide film doped with impurities to fall within a predetermined range and thereby enhancing the environment resistance reliability, and to provide a photovoltaic device using the photovoltaic element.

Another object of the present invention is to provide a photovoltaic element capable of preventing diffusion of alkaline ions without decreasing the energy conversion efficiency by controlling the ratio of regions including small tilt angle grain boundaries in the surface of a transparent conductive film made of an indium oxide film doped with impurities to fall within a predetermined range and thereby enhancing the environment resistance reliability, and to provide a photovoltaic device using the photovoltaic element.

Still another object of the present invention is to provide a photovoltaic element capable of increasing the bond strength between the transparent conductive film and a collecting electrode by controlling the surface roughness of the transparent conductive film to fall within a predetermined range or controlling the sizes of crystal grains of indium oxide of the transparent conductive film to fall within a predetermined range, and to provide a photovoltaic device using the photovoltaic element.

Yet another object of the present invention is to provide a photovoltaic element capable of preventing diffusion of alkaline ions without decreasing the energy conversion efficiency by having an orientation of (321) planes on the boundary side of the transparent conductive film with respect to the semiconductor layer and thereby enhancing the environment resistance reliability, and to provide a photovoltaic device using the photovoltaic element.

A further object of the present invention is to provide a photovoltaic element capable of obtaining a high preventing rate against diffusion of alkaline ions by controlling the ratio of (321) diffraction strength to (222) diffraction strength on the boundary side of the transparent conductive film with respect to the semiconductor layer to fall within a predetermined range, and to provide a photovoltaic device using the photovoltaic element.

A photovoltaic element of the first aspect is a photovoltaic element with a transparent conductive film arranged on the light incident side of a semiconductor layer comprising an amorphous semiconductor or a microcrystalline semiconductor, wherein the transparent conductive film is an indium oxide film doped with impurities, and the (222) plane orientation degree of the transparent conductive film is not less than 1.0. In the first aspect, since the transparent conductive film made of an ITO film, for example, having the (222) plane orientation degree of not less than 1.0 is arranged on the semiconductor layer such as a pin junction, the transparent conductive film itself has the function of preventing diffusion of alkaline ions such as Na, Li, and K. Therefore, it is not necessary to provide a special diffusion preventing layer, and it is possible to prevent diffusion of alkaline ions in an inexpensive manner.

A photovoltaic element of the second aspect is based on the first aspect, wherein the (222) plane orientation degree is not less than 1.2 and not more than 2.6. Therefore, the photovoltaic element has a high alkali resistance of 90% or more for the output characteristics.

A photovoltaic element of the third aspect is based on the first aspect, wherein the (222) plane orientation degree is not less than 1.4 and not more than 2.5. Therefore, the photovoltaic element has an extremely high alkali resistance of 95% or more for the output characteristics.

A photovoltaic element of the fourth aspect is a photovoltaic element with a transparent conductive film arranged on the light incident side of a semiconductor layer comprising an amorphous semiconductor or a microcrystalline semiconductor, wherein the transparent conductive film is an indium oxide film doped with impurities, and 40% or more of the surface of the transparent conductive film is occupied by regions including small tilt angle grain boundaries. 40% or more of the surface of the transparent conductive film (for example, an ITO film) is occupied by regions including small tilt angle grain boundaries, and the transparent conductive film itself has the function of preventing diffusion of alkaline ions such as Na, Li, and K, thereby preventing diffusion of alkaline ions.

A photovoltaic element of the fifth aspect is based on any one of the first through fourth aspects, and further comprises a collecting electrode on the surface of the transparent conductive film, wherein the surface roughness of the transparent conductive film is not less than 1.1 and not more than 3.0. Since the surface roughness of the transparent conductive film is not less than 1.1 and not more than 3.0, the bond strength of the collecting electrode to the transparent conductive film increases, and thereby ensuring long-term reliability.

A photovoltaic element of the sixth aspect is based on the fifth aspect, wherein the sizes of crystal grains contained in the transparent conductive film are not less than 6 nm and not more than 100 nm. Since the sizes of crystal grains contained in the transparent conductive film (for example, an ITO film) are between 6 nm and 100 nm, the bond strength of the collecting electrode to the transparent conductive film increases, and thereby ensuring long-term reliability.

A photovoltaic element of the seventh aspect is a photovoltaic element with a transparent conductive film arranged on the light incident side of a semiconductor layer comprising an amorphous semiconductor or a microcrystalline semiconductor, wherein the transparent conductive film is an indium oxide film doped with impurities, and has an orientation of (321) planes on the boundary side with respect to the semiconductor layer and an orientation of (222) planes on the side opposite to the semiconductor layer. The transparent conductive film has an orientation of (321) planes on the boundary side with respect to the semiconductor layer, and an orientation of (222) planes is dominant in other portion of the transparent conductive film. Therefore, the transparent conductive film itself can function as a diffusion preventing layer against alkaline ions such as Na, Li, and K.

A photovoltaic element of the eighth aspect is based on the seventh aspect, wherein, in a 10 nm-thick portion on the semiconductor layer side of the transparent conductive film, the ratio of (321) diffraction strength to (222) diffraction strength measured by X-ray diffraction is not less than 0.5 and not more than 2.5. Since the ratio of (321) diffraction strength to (222) diffraction strength in the 10 nm-thick portion on the semiconductor layer side of the transparent conductive film (for example, an ITO film) is not less than 0.5 and not more than 2.5, it is possible to have an alkali resistance of 98% or more for the output characteristics.

A photovoltaic device of the ninth aspect comprises: a photovoltaic element of any one of the first through eighth aspects; and a transparent member (cover glass) containing alkaline ions, arranged on the light incident side of the transparent conductive film. Thus, an alkaline ion diffusion preventing layer is provided in an inexpensive manner, and long-term reliability is ensured.

A photovoltaic device of the tenth aspect is based on the ninth aspect, and further comprises a resin film arranged on the side opposite to the light incident side of the semiconductor layer. Thus, long-term reliability is ensured in an inexpensive manner.

The above and further objects and features of the invention will more fully be apparent from the following detailed description with accompanying drawings.

DETAILED DESCRIPTION OF THE INVENTION

The following description will explain the present invention specifically with reference to the drawings illustrating some embodiments thereof.

Figure 1:
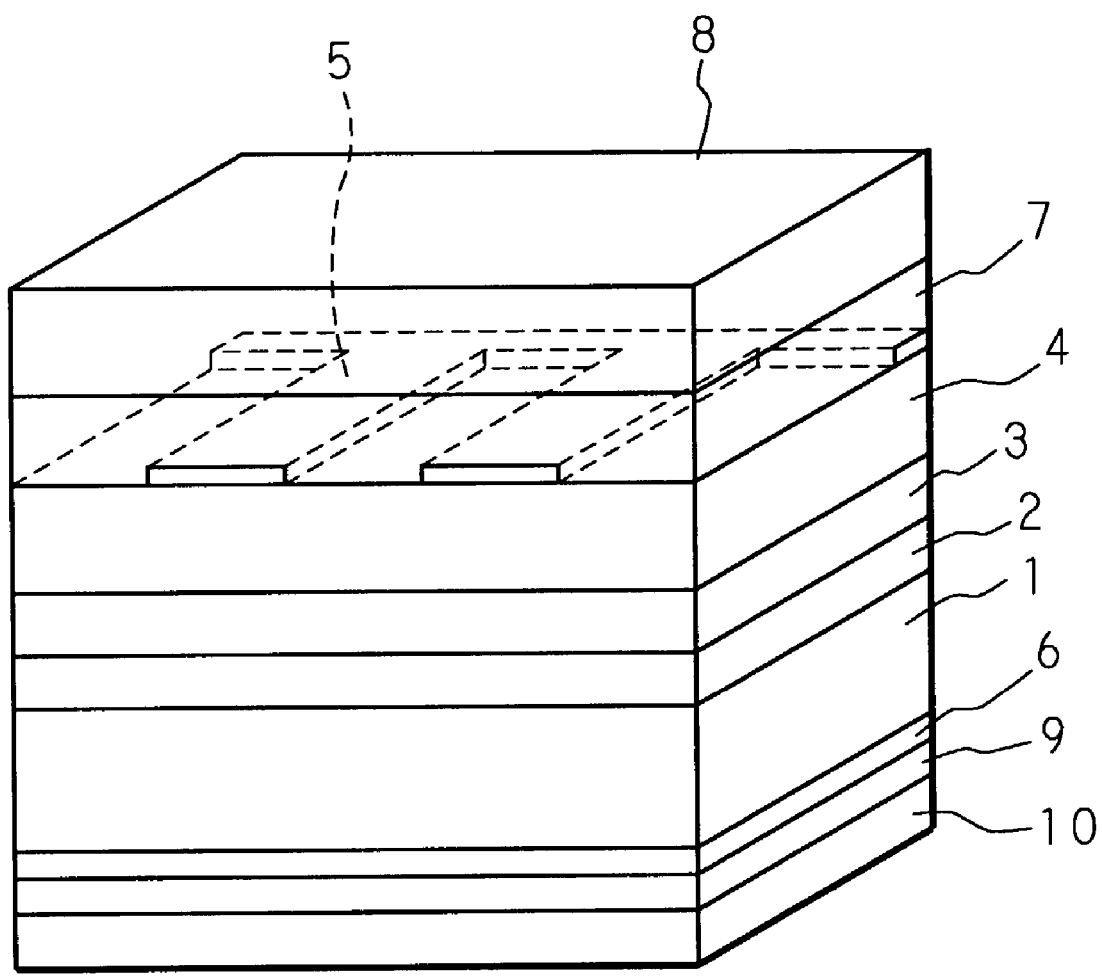
FIG. 1 is a perspective view showing one example of a photovoltaic device of the present invention.
Figure 2:
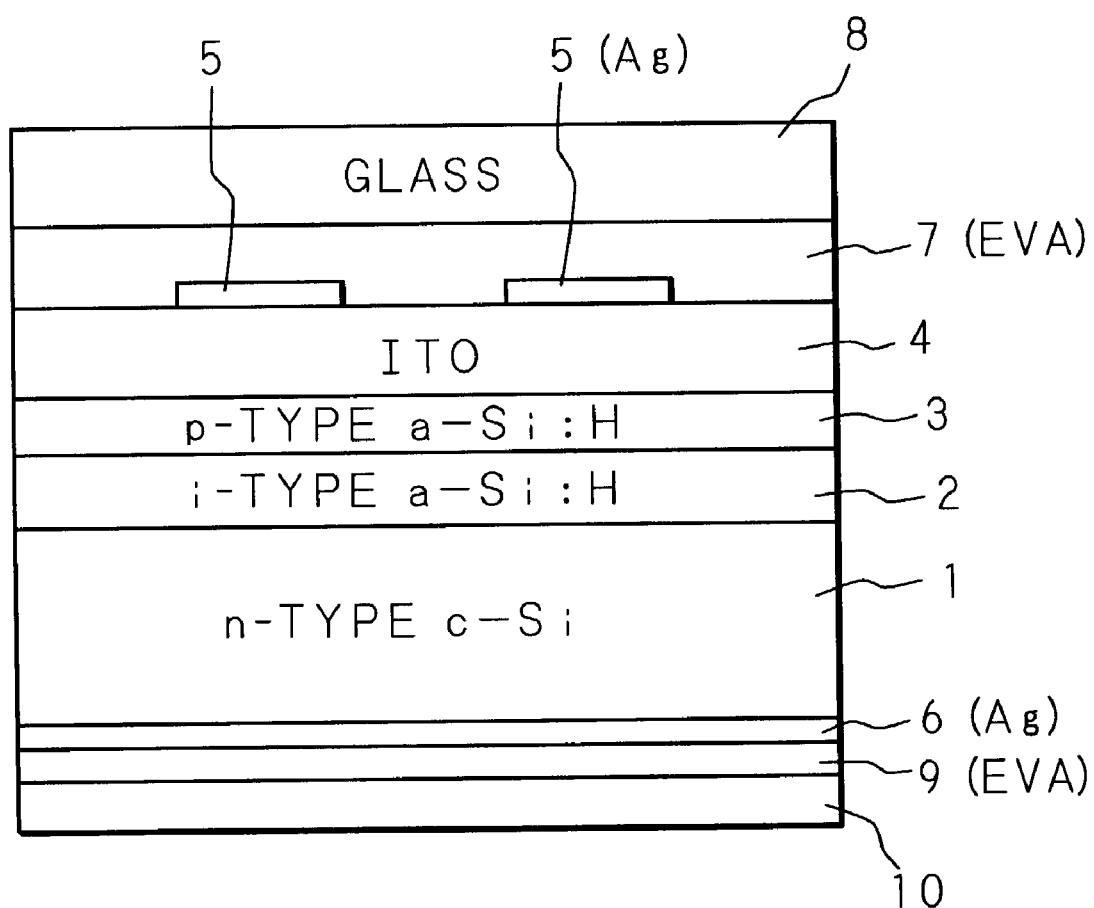
FIG. 2 is a schematic cross sectional view showing one example of a photovoltaic device of the present invention.

FIG. 1 and FIG. 2 are the perspective view and schematic cross sectional view showing one example of a photovoltaic device of the present invention. In these figures, 1 represents an n-type crystalline silicon wafer made of a crystalline semiconductor such as monocrystalline silicon and polycrystalline silicon. On a surface of the silicon wafer 1, an i-type amorphous silicon hydride layer (hereinafter referred to as the i-type a-Si:H layer) 2 and a p-type amorphous silicon hydride layer (hereinafter referred to as the p-type a-Si:H layer) 3 are formed in layers so as to produce a semiconductor layer having a pin junction.

After removing impurities from the n-type (100) silicon wafer 1 with about 1 Ω·cm and a thickness of 300 μm by normal washing, the i-type a-Si:H layer 2 and p-type a-Si:H layer 3 are deposited in about 5 nm each by a known RF plasma CVD technique so as to form the pin junction. When deposing the i-type a-Si:H layer 2 and p-type a-Si:H layer 3, the formation temperature is 100 to 300° C., the reaction pressure is 5 to 100 Pa, and the RF power is 1 to 50 mW/cm². As a p-type dopant used when forming the p-type a-Si:H layer 3, any one of B, Al, Ga and In which are group 13 elements is used. By mixing a compound gas containing at least one of these elements into a source gas such as SiH₄, it is possible to control the amorphous layer to be p-type.

The i-type a-Si:H layer 2 and p-type a-Si:H layer 3 can be formed using known techniques such as a vapor deposition technique, a sputtering technique, a microwave plasma CVD technique, an ECR technique, a thermal CVD technique, and an LPCVD technique, instead of the RF plasma CVD technique. Note that the semiconductor that forms the semiconductor layer may be any one of amorphous or microcrystalline Si, SiGe, SiGeC, SiC, SiN, SiGeN, SiSn, SiSnN, SiSnO, SiO, Ge, GeC and GeN containing at least either hydrogen or fluorine.

An ITO film 4 as a transparent conductive film is formed on the surface of the p-type a-Si:H layer 3 by a sputtering technique. A sintered body of an $In_2O_3$ powder containing 5 wt % of $SnO_2$ powder mixed therein is mounted as a target on the cathode. After arranging the laminated product of the silicon wafer 1, i-type a-Si:H layer 2 and p-type a-Si:H layer 3 to be parallel to and face the cathode, a chamber is evacuated. The temperature of the laminated product (substrate temperature) is kept at 25 to 250° C. using a heater, the pressure is kept at 0.4 to 1.3 Pa by a flow of a mixed gas of Ar and $O_2$ (Ar flow rate: 200 to 800 sccm, $O_2$ flow rate: 0 to 30 sccm), and 0.5 to 2 kW DC power is supplied to the cathode so as to start discharging. The film deposition rate when the laminated product is stationary against the cathode is about 67 nm/min.

Since the intake amount of atmospheric gas to the ITO film 4 depends on the deposition rate, it is more appropriate to take (partial pressure)/(deposition rate) as a parameter than taking the partial pressure as a parameter. A preferred range of $O_2$ is from $5 \times 10^{-5}$ to $5 \times 10^{-4}$ Pa·min/nm. When $O_2$ is $5 \times 10^{-4}$ Pa·min/nm or more, the light absorption is low, but the specific resistance increases and the conversion efficiency decreases. On the other hand, when $O_2$ is $5 \times 10^{-5}$ Pa·min/nm or less, the resulting film has a high electron concentration and high light absorption, and the conversion efficiency decreases. $H_2O$ is preferably no higher than $2 \times 10^{-4}$ Pa·min/nm at the time of deposition. When the partial pressure of $H_2O$ is $2 \times 10^{-4}$ Pa·min/nm or more, the electron concentration becomes $6 \times 10^{20}$ cm$^{-3}$ or more, the light absorption increases, and the specific resistance becomes higher.

Instead of Ar, it is possible to use an inert gas such as He, Ne, Kr and Xe, or a mixed gas thereof. It is also possible to perform gas discharge by pulse modulation DC discharge, RF, VHF, or microwave discharge. Although the amount of Sn contained in the ITO film 4 can be changed by changing the amount of $SnO_2$ to be mixed, the amount of Sn, based on In, is preferably 1 to 10 at %, and more preferably 3 to 7 at %. A preferred sintered density of the target is 90% or more. Note that, instead of Sn, it is possible to use at least one of Zn, As, Ca, Cu, F, Ge, Mg, S, Si and Te as a dopant into the indium oxide.

By the way, by controlling the various conditions (such as the substrate temperature, Ar and $O_2$ flow rates, $O_2$ partial pressure, and cathode voltage) in the above-described process of fabricating the ITO film 4 (transparent conductive film), it is possible to control the orientation of the resulting ITO film 4, particularly the orientation in the vicinity of the boundary surface next to the p-type a-Si:H layer 3. The control of this orientation that is a characteristic feature of the present invention will be described in detail later.

Moreover, a comb-like collecting electrode 5 is formed on the ITO film 4. After forming a silver paste, which was obtained by kneading a silver fine powder into an epoxy resin, in a height of 10 to 30 μm and a width of 100 to 500 μm by screen printing, the silver paste is sintered and hardened for 80 minutes at 200° C. so as to form the collecting electrode 5 composed of comb-like electrodes having a plurality of mutually parallel branch parts and a bus-bar electrode for collecting currents flowing in these comb-like electrodes.

On the back surface of the silicon wafer 1, a back electrode 6 made of a metal film such as Ag and Al is formed. This back electrode 6 is formed by a known vapor deposition process using sputtering, resistance heating, or an energy beam.

The photovoltaic device (solar cell module) is a product obtained by incorporating a photovoltaic element having the component members as described above as a module. On the ITO film 4 and collecting electrode 5, a transparent resin film 7 made of EVA (ethylene vinyl acetate), for example, is placed. Furthermore, on the resin film 7, a cover glass 8 containing alkaline ions such as Na, Li and K is provided for the purpose of protecting the photovoltaic element over a long time. In addition, a back protecting film 10 is placed on the backside electrode 6 with a resin layer 9 made of EVA, for example, therebetween.

The following description will explain the relationship between the orientation property and the sodium resistance of the ITO film (transparent conductive film) of the present invention, based on the results of tests performed by the present inventors et al. to evaluate the characteristics of the ITO film. First, various parameters about the orientation property and sodium resistance will be explained.

It is possible to evaluate the macro-orientation property of the ITO film by X-ray diffraction. The orientation degree Q (pqr) of crystal plane (pqr) is defined by the following equation.

$$Q(pqr)=(I(pqr)/\Sigma I(hkl))/I^*(pqr)/\Sigma I^*(hkl))$$

Here, I(hkl) is the peak strength of X-ray diffraction from the (hkl) plane, and $\Sigma I(hkl)$ means adding all the peak strengths. Moreover, $I^*(hkl)$ means the peak strength of the (hkl) plane for a powder sample. For example, "(222) oriented" means that the orientation degree is higher than the average value of the powder sample, i.e., the ratio of crystal grains with (222) planes parallel to the surface of the silicon wafer 1 is higher than that of crystal grains with (222) planes oriented at random.

Furthermore, by measuring the strengths of diffraction lines of X-ray diffraction for two kinds of crystal planes and calculating the ratio of the measured diffraction strengths of the two planes, the calculated strength ratio can be used as the index of the orientation property of the ITO film.

Besides, the anti-sodium ratio that is used as the index for the evaluation of the resistance against sodium ions is defined as follows. The anti-sodium ratio is a change rate of the output of the photovoltaic element when 0.1 g of 0.05% NaHCO$_3$ aqueous solution was applied to the surface of the ITO film and left for 3 hours at 200° C. More specifically, the anti-sodium ratio is defined as the ratio of the measurement of maximum output ($P_{max}$') after the treatment to the measurement of maximum output ($P_{max}$) before the treatment, that is, a value obtained by standardizing $P_{max}$' by $P_{max}$, i.e., $P_{max}'/P_{max}$.

Figure 3A:
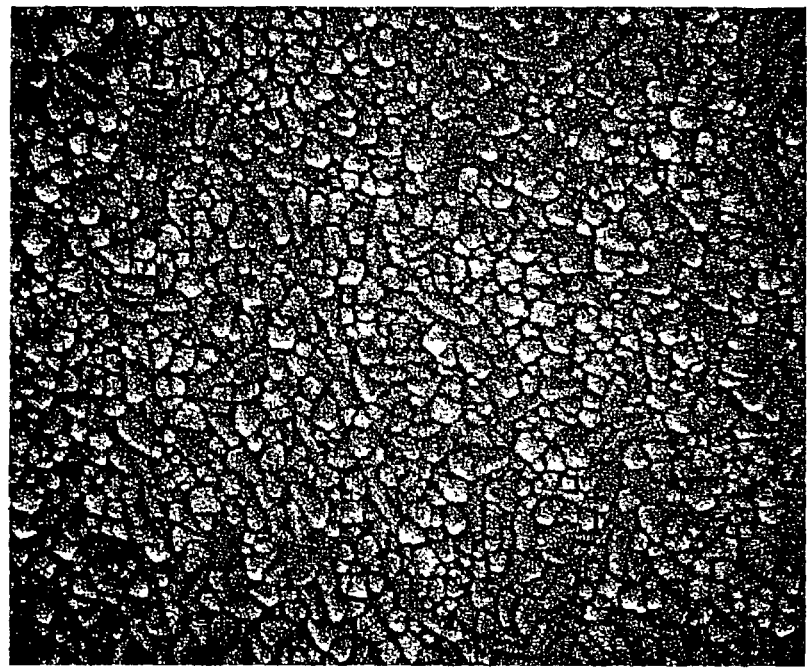
FIGS. 3A and 3B are photographs showing secondary electron images of the surface of an ITO film.
Figure 3B:
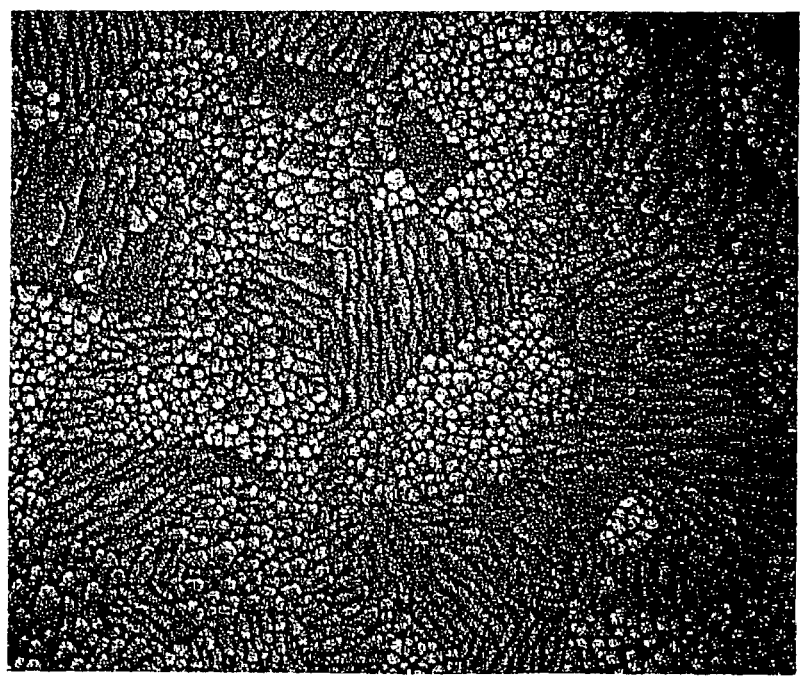

FIGS. 3A and 3B are photographs showing secondary electron images (hereinafter referred to as the SEM images) of the surface of the ITO film. FIG. 3A is the SEM image of the surface of the ITO film formed on an amorphous silicon hydride. FIG. 3B is the SEM image of the surface of the ITO film formed on glass under the same conditions. It can be found by comparing FIGS. 3A and 3B that there is a complete difference in the shapes of ITO crystals. It can be understood from this fact that, when the amorphous silicon hydride and the glass are used as the layers on which the ITO films are to be deposited, there is a complete difference between the characteristics of the ITO films deposited thereon.

Figure 4:
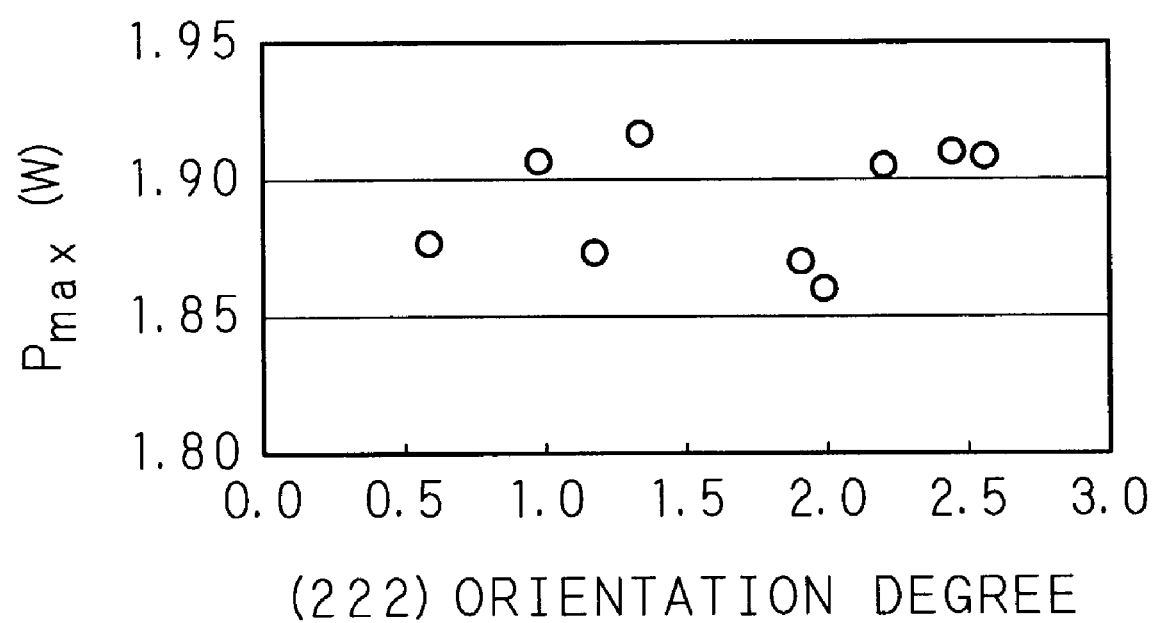
FIG. 4 is a graph showing the relationship between the (222) orientation degree and $P_{max}$ (the measurement of maximum output of a photovoltaic element before a sodium resistance test)
Figure 5:
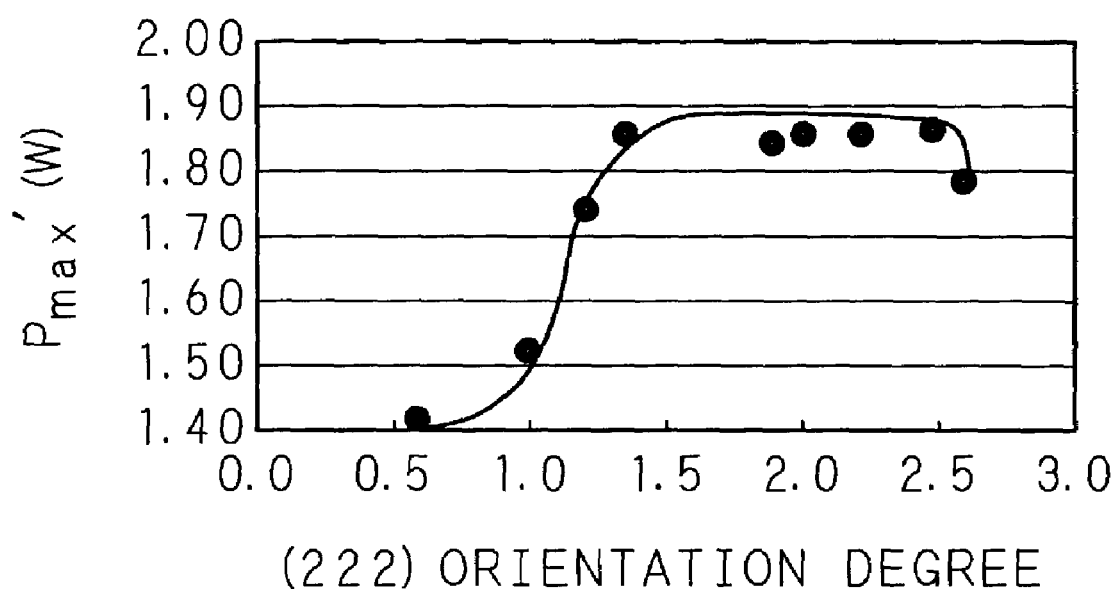
FIG. 5 is a graph showing the relationship between the (222) orientation degree and $P_{max}'$ (the measurement of maximum output of the photovoltaic element after the sodium resistance test)
Figure 6:
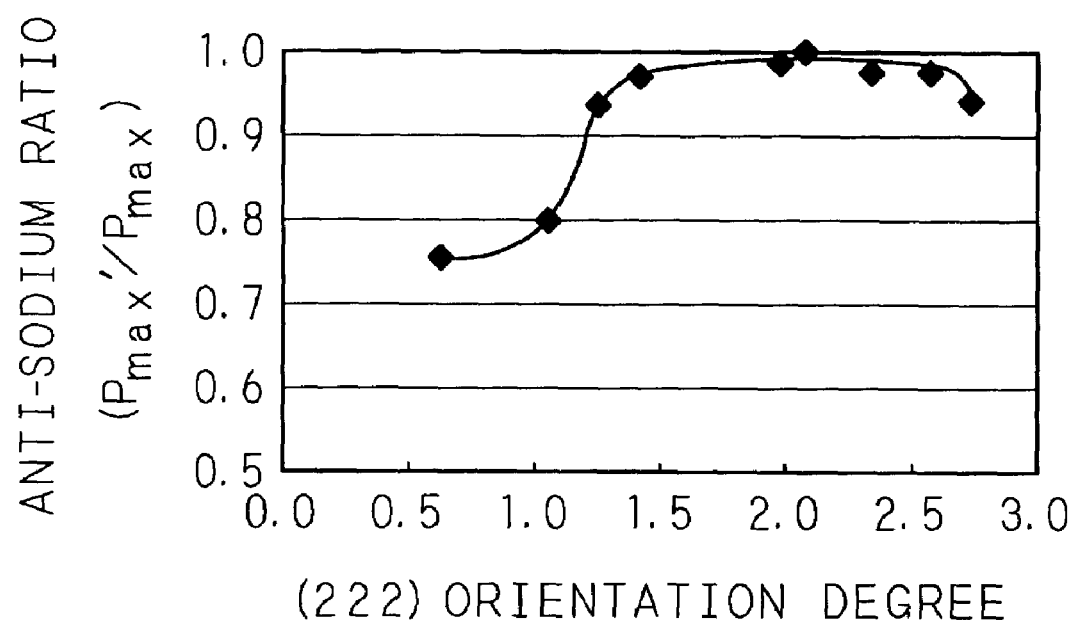
FIG. 6 is a graph showing the relationship between the (222) orientation degree and the anti-sodium ratio ($P_{max}'/P_{max}$)

FIGS. 4 through 6 are graphs showing the relationship between the (222) orientation property and the sodium resistance of the ITO film. FIG. 4 is a graph showing the relationship between the (222) orientation degree and $P_{max}$; FIG. 5 is a graph showing the relationship between the (222) orientation degree and $P_{max}$'; and FIG. 6 is a graph showing the relationship between the (222) orientation degree and the anti-sodium ratio ($P_{max}'/P_{max}$).

It can be understood from the results of FIG. 6 that the sodium resistance is improved when the ITO film is (222) oriented with respect to the surface of the semiconductor layer, and particularly when the (222) orientation degree is 1.0 or more. Moreover, a high anti-sodium ratio of not less than 0.9 is obtained when the (222) orientation degree is not less than 1.2 and not more than 2.6. Further, an extremely high anti-sodium ratio of not less than 0.95 is obtained when the (222) orientation degree is not less than 1.4 and not more than 2.5. It can thus be understood that, by setting the (222) orientation degree of the ITO film to an appropriate value, there is almost no change in the output before and after the application of the NaHCO$_3$ aqueous solution, and a high prevention effect is obtained against sodium diffusion. It can also be understood from the results of FIGS. 5 and 6 that it is possible to provide a photovoltaic element having an extremely high anti-sodium ratio of not less than 0.95 and extremely high output of not less than 1.88 W after the sodium resistance test when the (222) orientation degree is not less than 1.4 and not more than 2.5.

Figure 7:
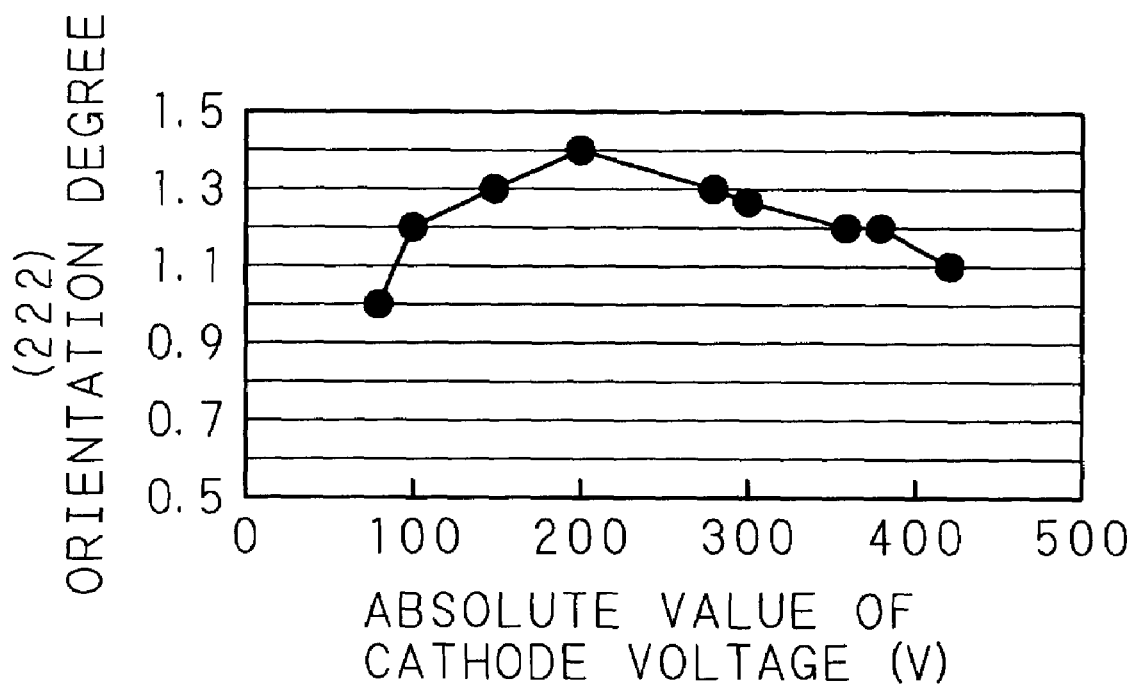
FIG. 7 is a graph showing the relationship between the absolute value of cathode voltage and the (222) orientation degree.
Figure 8:
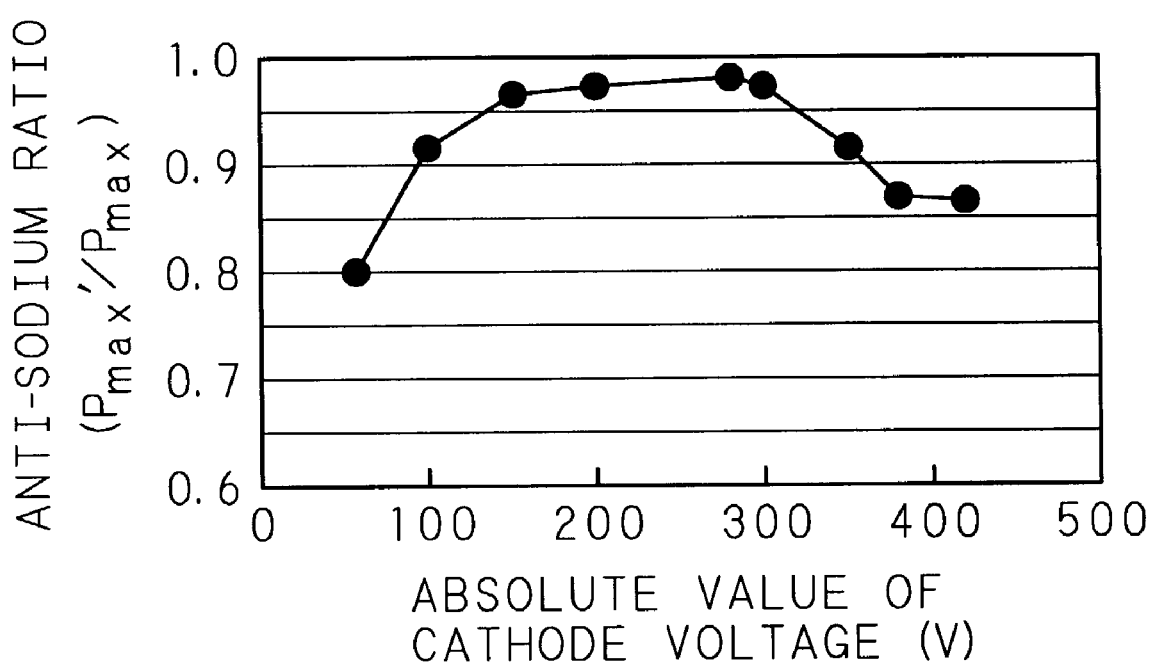
FIG. 8 is a graph showing the relationship between the absolute value of cathode voltage and the anti-sodium ratio.

FIG. 7 is a graph showing the relationship between the absolute value of cathode voltage and the (222) orientation degree; and FIG. 8 is a graph showing the relationship between the absolute value of cathode voltage and the anti-sodium ratio. It can be understood from the results of FIG. 7 that, when the absolute value of cathode voltage is set between 100 V and 400 V during deposition of the ITO film on the semiconductor layer (p-type a-Si:H layer), the (222) orientation degree of the ITO film changes within a narrow range of 1.1 to 1.5. On the other hand, it can be understood from the results of FIG. 8 that, when the absolute value of cathode voltage is increased from 100 V, the anti-sodium ratio decreases in a region exceeding 300 V.

Figure 9A:
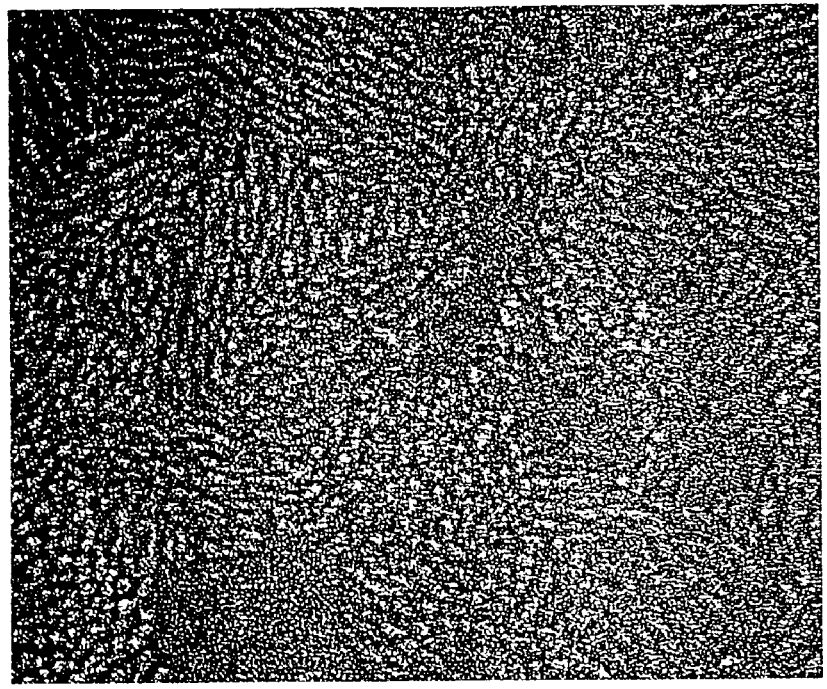
FIGS. 9A and 9B are photographs showing SEM images obtained when the cathode voltage was changed.
Figure 9B:
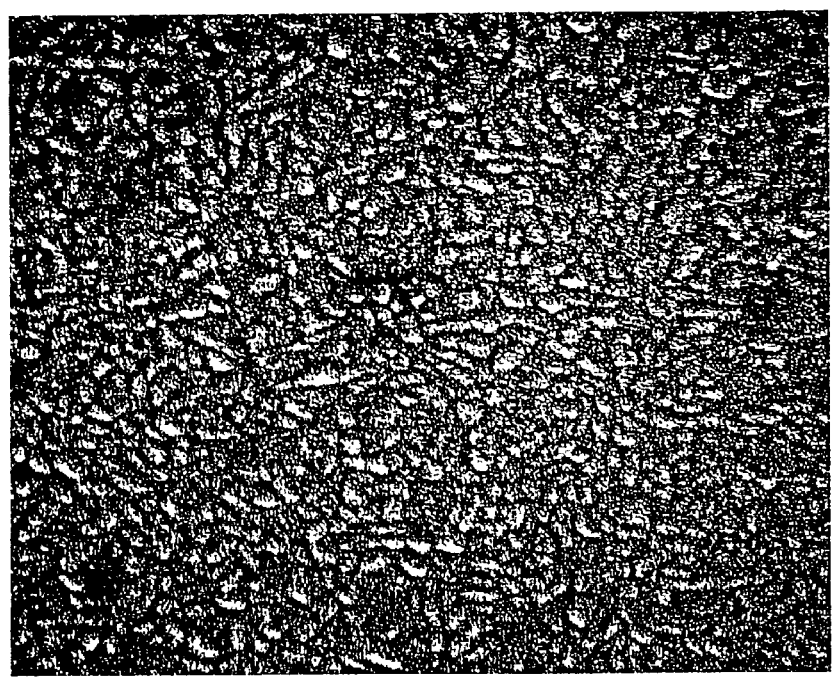
Figure 10:
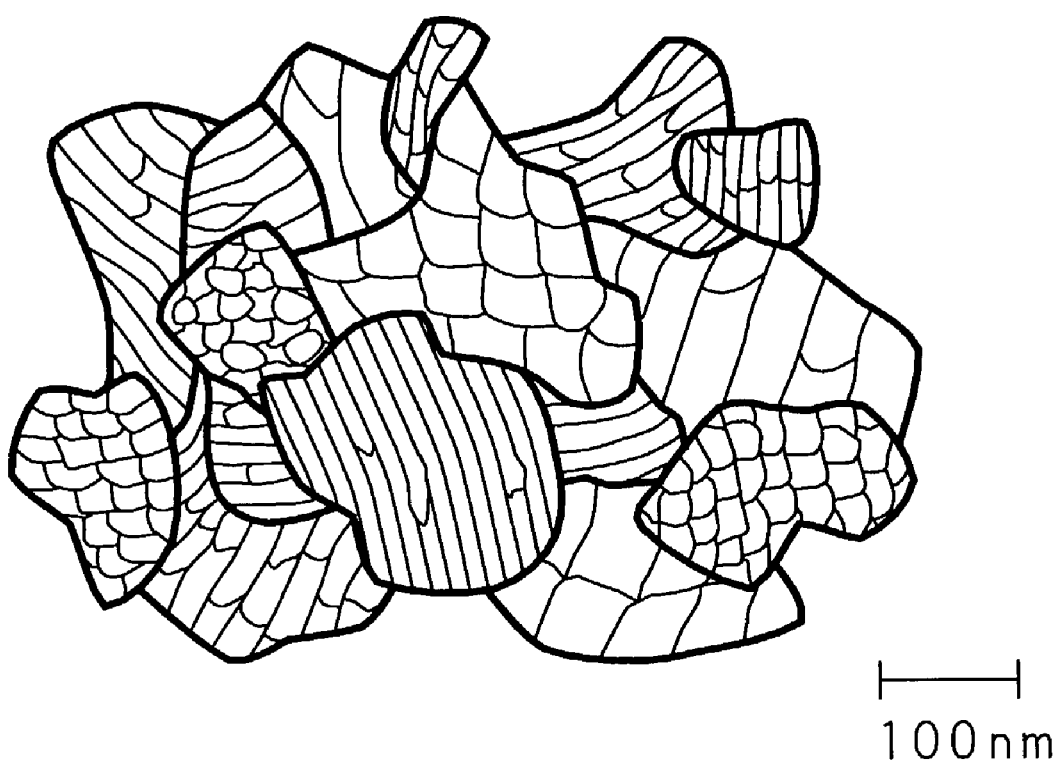
FIG. 10 is a schematic view of small tilt angle grain boundaries.

Hence, the present inventors et al. examined the relationship between the micro-orientation property and the sodium resistance of the ITO film by taking SEM images of the surface of the ITO film while changing the cathode voltage. FIGS. 9A and 9B are photographs showing the SEM images when the cathode voltage is changed. FIGS. 9A and 9B show the SEM images of the surface of the ITO film when the cathode voltages is −280 V and −380 V, respectively, and it can be seen that there is a great difference in the shapes of crystal grains. It can be understood that, when the cathode voltage is −280 V, adjacent crystal grains have almost no difference in the orientations and thus have a small tilt angle grain boundary, while, when the cathode voltage is −380 V, the orientations of adjacent crystal grains do not align well. Here, as shown in the schematic view of the small tilt angle grain boundaries of FIG. 10, the small tilt angle grain boundary means the surface configuration composed of crystal grains whose crystal orientations are aligned, and it can be easily discriminated using an SEM image of the surface, etc.

Figure 11:
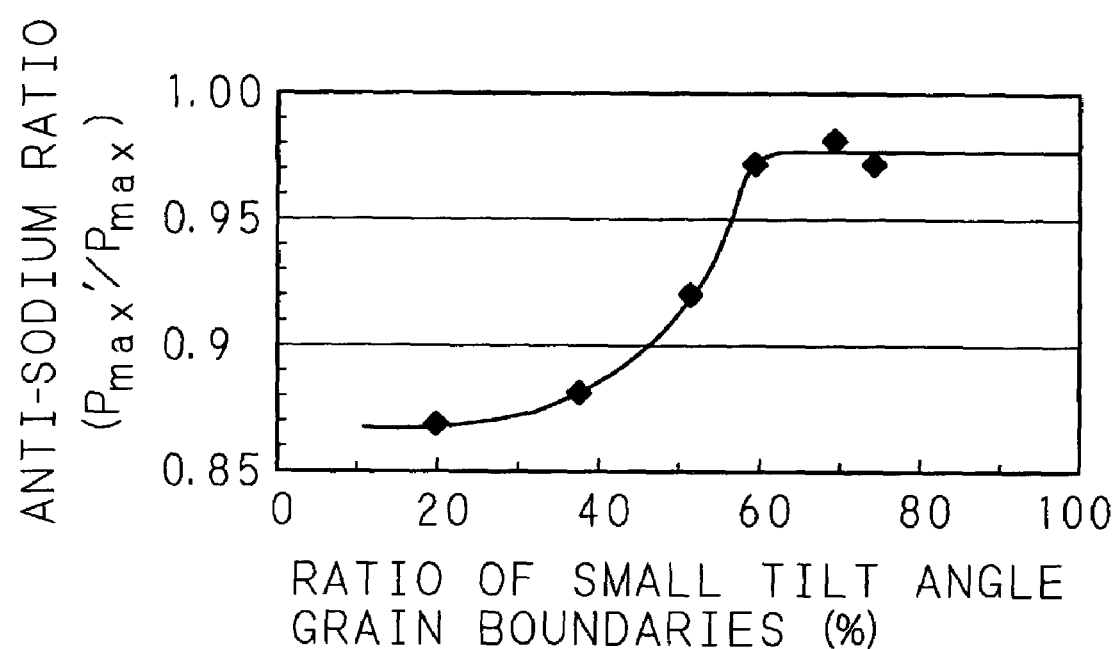
FIG. 11 is a graph showing the relationship between the ratio of the small tilt angle grain boundaries and the anti-sodium ratio.

FIG. 11 is a graph showing the relationship between the ratio of the small tilt angle grain boundaries and the anti-sodium ratio. It can be understood that, when the ratio of the small tilt angle grain boundaries in the surface of the ITO film is changed, the anti-sodium ratio started to improve around the time the ratio of the small tilt angle grain boundaries reaches 40%, and an extremely high anti-sodium ratio of not less than 0.92 is obtained at the time the ratio exceeds 50%.

Hence, it is proved that the micro-orientation properties of crystals as well as the macro-orientation properties are important for sodium diffusion in the polycrystalline ITO film. It is considered that, when adjacent crystal grains have substantially aligned orientations and thus have a small tilt angle grain boundary, the sodium diffusion coefficient can be decreased. In other words, in the polycrystalline ITO film, the greater the regions of the surface thereof parted by the small tilt angle grain boundaries, the higher the sodium resistance.

The bond strength between the ITO film and the collecting electrode formed on the ITO film was examined. The bond strength was measured by the following method. After soldering a copper tab electrode having a solder coating onto the collecting electrode by heating the tab electrode in contact with the collecting electrode, the tab electrode is bent to be perpendicular to the surface of the ITO film and pulled up at equal speed until the collecting electrode is separated from the ITO film. The tensile strength at this time is defined as the bond strength. Besides, the surface roughness of the ITO film is defined by the ratio between the surface area of the ITO film within the measurement region and the measured area. When there is no unevenness in the surface of the ITO film, the value of the surface roughness is 1, while, when there is unevenness, the surface roughness takes a value greater than 1.

Figure 12:
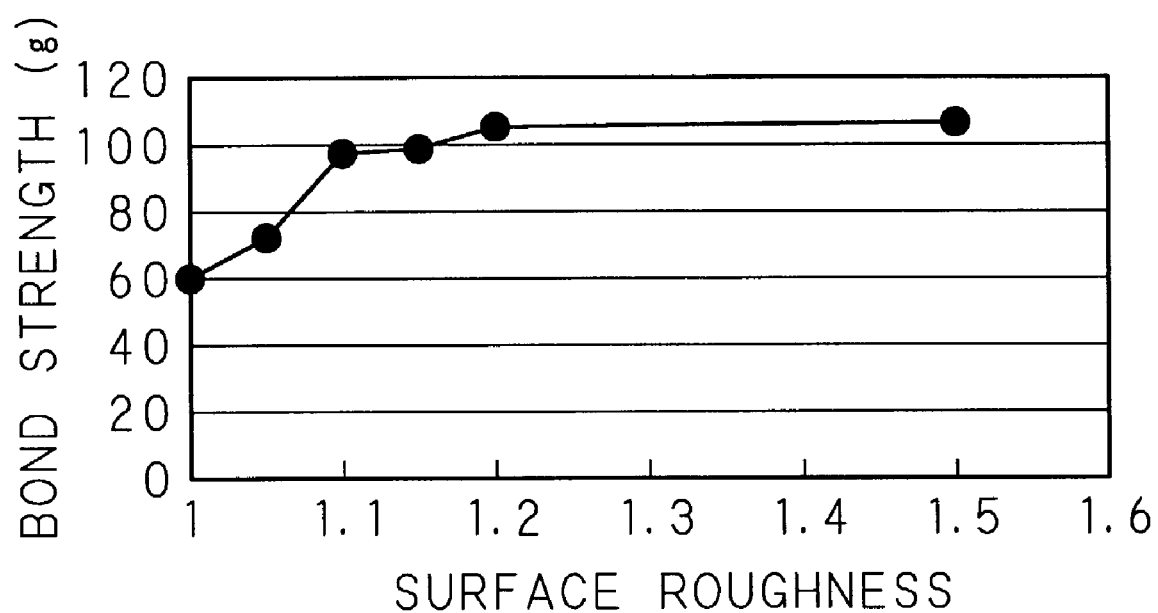
FIG. 12 is a graph showing the relationship between the surface roughness of the ITO film and the bond strength.

FIG. 12 is a graph showing the relationship between the surface roughness of the ITO film and the bond strength. It can be seen from FIG. 12 that the bond strength increases when the surface roughness increases. When the surface roughness of the ITO film increases, the tensile strength necessary for separating the collecting electrode from the ITO film tends to increase. According to FIG. 12, the surface roughness is preferably not less than 1.1. If the surface roughness is greater than 3.0, since the uneven pattern in the surface of the ITO film is deep and narrow, the silver paste can not reach the bottom of the uneven pattern when forming the collecting electrode, resulting in decreases in the bond strength between the ITO film and the collecting electrode and in the electrical contact. Therefore, the surface roughness needs to be 3.0 or less.

In this embodiment, the surface roughness is controlled by the crystal grain size. In this case, the crystal grain size is preferably 6 to 100 nm, and more preferably 10 to 80 nm. Here, the crystal grain size means the maximum length of crystal grain in the plane direction of the ITO film. Note that it is also possible to control the surface roughness by performing etching with a diluted hydrochloric acid, etc. after the deposition of the ITO film.

Figure 13:
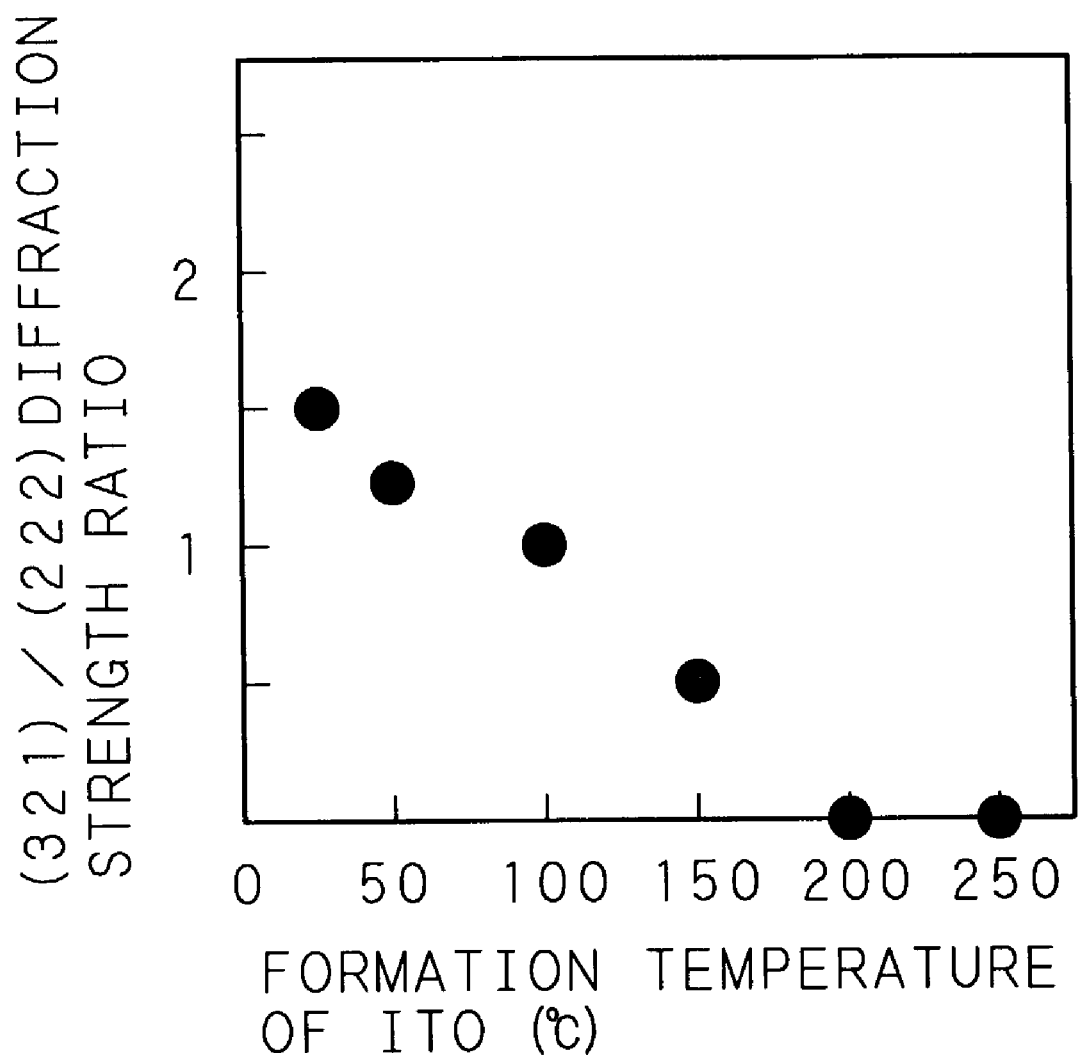
FIG. 13 is a graph showing the relationship between the formation temperature of the ITO film and the (321)/(222) diffraction strength ratio.

FIG. 13 is a graph showing the relationship between the formation temperature of the ITO film and the ratio of the (321) diffraction strength to the (222) diffraction strength. The axis of abscissas indicates the substrate temperature during the formation of the ITO film, while the axis of ordinates indicates the ratio of the (321) diffraction strength to the (222) diffraction strength in the boundary layer of the ITO film (the 10 nm-thick portion on the semiconductor layer side of the ITO film with a total thickness of 100 nm).

The characteristics of the boundary layer were evaluated as follows. First, with the use of an ITO target doped with 5 at % $SnO_2$, the ITO film was deposited in a thickness of 100 nm on the surface of a semiconductor layer (p-type a-Si:H layer) by changing the substrate temperature, under the conditions that the Ar flow rate was 200 sccm, the oxygen flow rate was 12 sccm, the pressure was 0.5 Pa, and the DC power was 1 kW. Note that, when the crystallinity of the resulting films was evaluated by X-ray diffraction, it was confirmed that the ITO film formed at a temperature of not more than 100° C. had many amorphous grains but had the highest (321) plane diffraction strength, and that the ITO film formed at a temperature of not less than 150° C. was a polycrystalline film with a strong orientation of (222) planes.

Next, after applying a heat treatment to the ITO film for 80 minutes at 200° C. in the atmosphere, the surface portion of the ITO film was removed by performing etching with a 35% HCl aqueous solution for 5 to 7 minutes so as to leave a boundary layer with a thickness of about 10 nm on the surface of the semiconductor layer. Then, the crystallinity of the ITO film as the boundary layer was evaluated by X-ray diffraction. As a result, when the substrate temperature during the formation of the ITO film was 200° C. or more, the boundary layer was strongly oriented in the (222) plane, and the second strongest diffraction strength was marked by the diffraction line from the (400) plane.

However, in the boundary layer of the ITO film formed at a substrate temperature of not more than 150° C., a diffraction line from the (321) plane appeared, and it had the second strongest diffraction strength next to a diffraction line from the (222) plane. It was found that the ratio of the (321) diffraction strength to the (222) diffraction strength gradually increases with a decrease in the substrate temperature when forming the ITO film. In other words, as shown in FIG. 13, it can be understood that, when the ITO film is formed at 150° C., the (321) plane diffraction strength is substantially a half of the (222) plane diffraction strength, when the ITO film is formed at 100° C., the (321) plane diffraction strength is substantially equal with the (222) plane diffraction strength, while when the formation temperature of the ITO film is not more than 100° C., the (321) plane diffraction strength is higher than the (221) plane diffraction strength, and the (321) plane is oriented dominantly.

Figure 14:
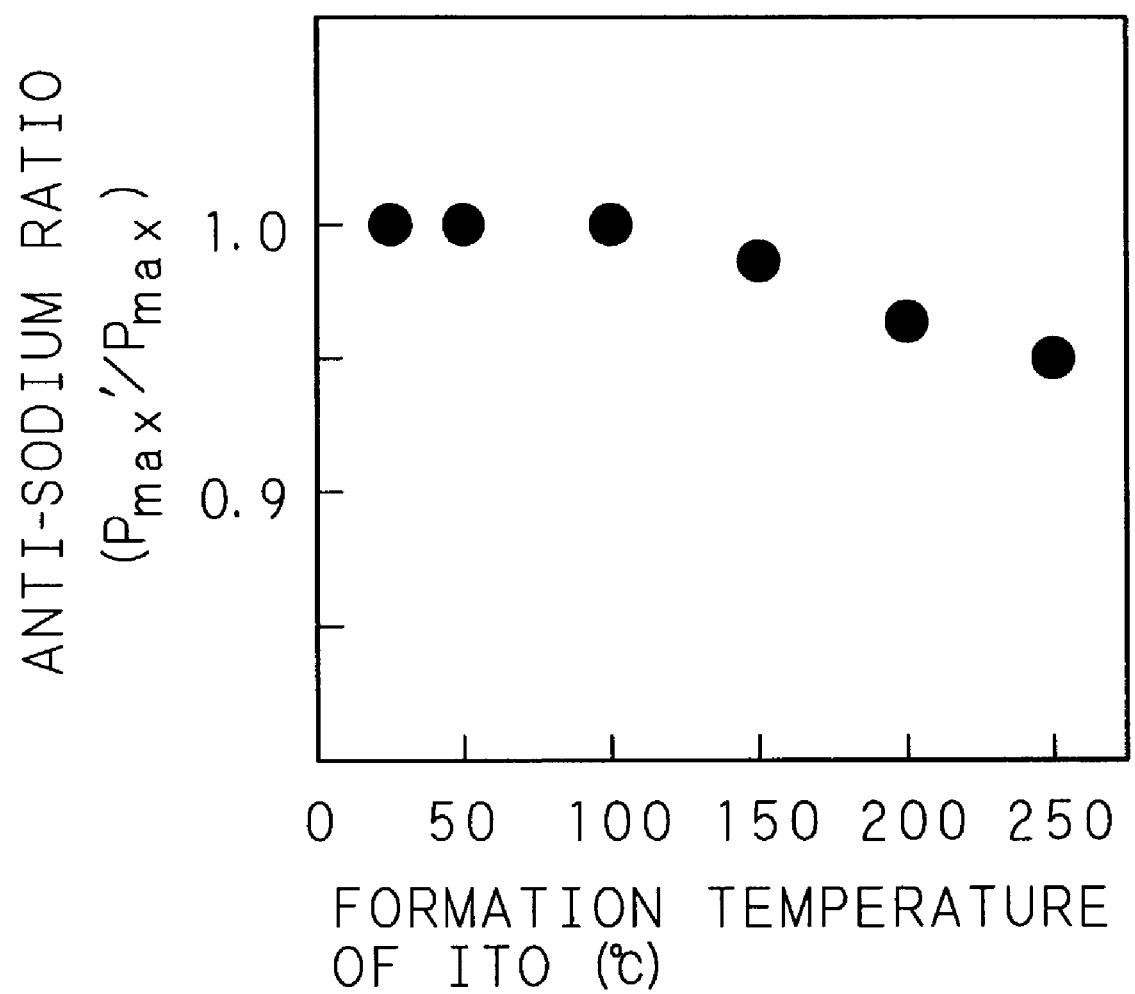
FIG. 14 is a graph showing the relationship between the formation temperature of the ITO film and the anti-sodium ratio.

FIG. 14 is a graph showing the relationship between the formation temperature of the ITO film and the anti-sodium ratio of the ITO film. As shown in FIG. 14, it is clear that the relative change between $P_{max}$ and $P_{max}'$ is small at the substrate temperature of not more than 150° C., and, particularly, an extremely good anti-sodium ratio is ensured at temperature not more than 100° C. In other words, there is correlation between the appearance of the diffraction line from the (321) plane and the sodium resistance, and an excellent sodium resistance can be realized under the conditions that the diffraction line from the (321) plane appears in the boundary surface of the ITO film in contact with the semiconductor layer and has the strongest or second strongest diffraction strength.

Figure 15:
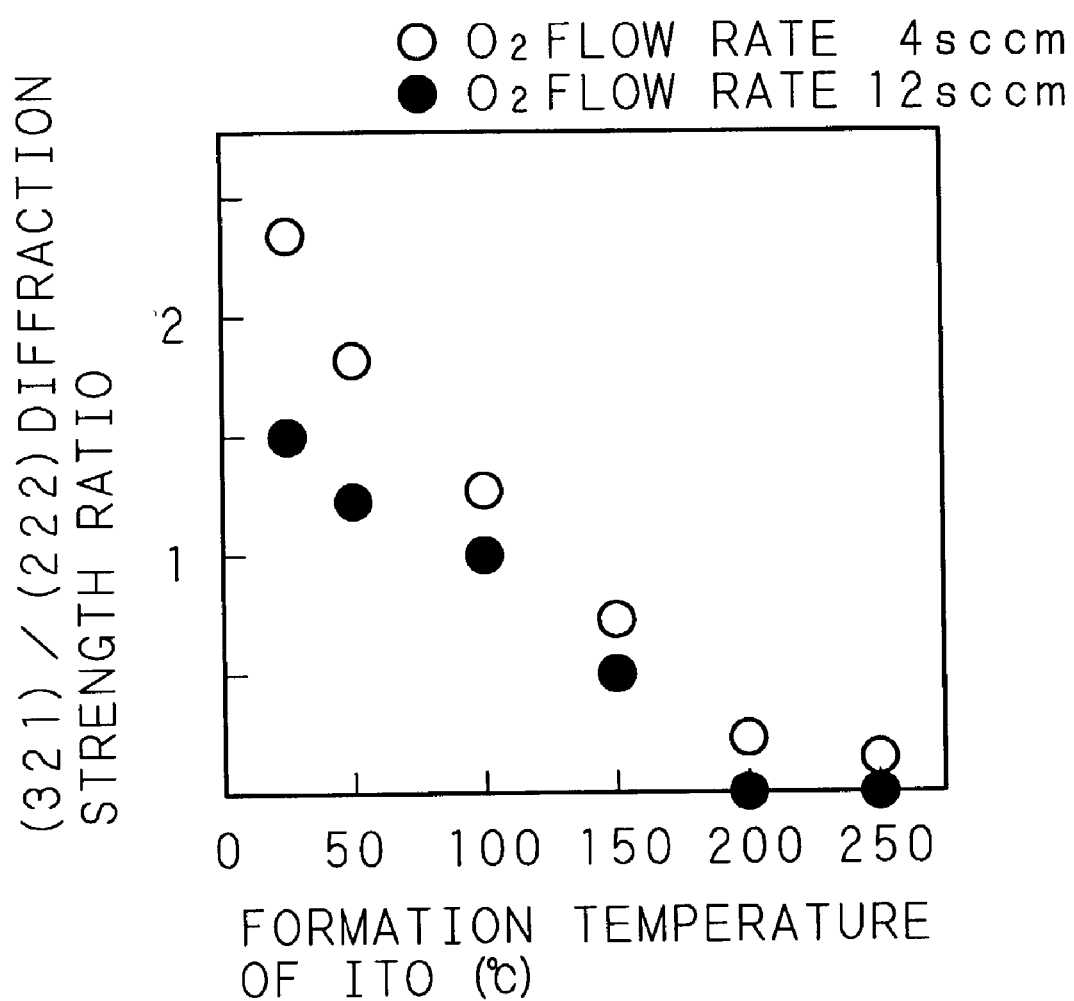
FIG. 15 is a graph showing the relationship between the formation temperature of the ITO film and the (321)/(222) diffraction strength ratio when the oxygen flow rate is 4 sccm and 12 sccm.

FIG. 15 is a graph showing the relationship between the formation temperature of the ITO film and the ratio of the (321) diffraction strength to the (222) diffraction strength when the oxygen rate was 4 sccm and 12 sccm. As shown in FIG. 15, when the oxygen flow is large, the (222) diffraction strength becomes stronger, whereas the (321) diffraction strength becomes weaker, and therefore the ratio of the (321) diffraction strength to the (222) diffraction strength becomes smaller. It is also clear that as the oxygen flow rate increases, the (321) diffraction line tends to appear at a lower temperature during the formation of the ITO film. As clear from the above-mentioned results, by forming the ITO film on the surface of the semiconductor layer by lowering the crystallinity beforehand under the conditions of low temperature and low oxygen flow rate and then improving the crystallinity of the ITO film by the heat treatment, the (321) diffraction line can easily appear in the boundary layer of the ITO film adjacent to the semiconductor layer.

Figure 16:
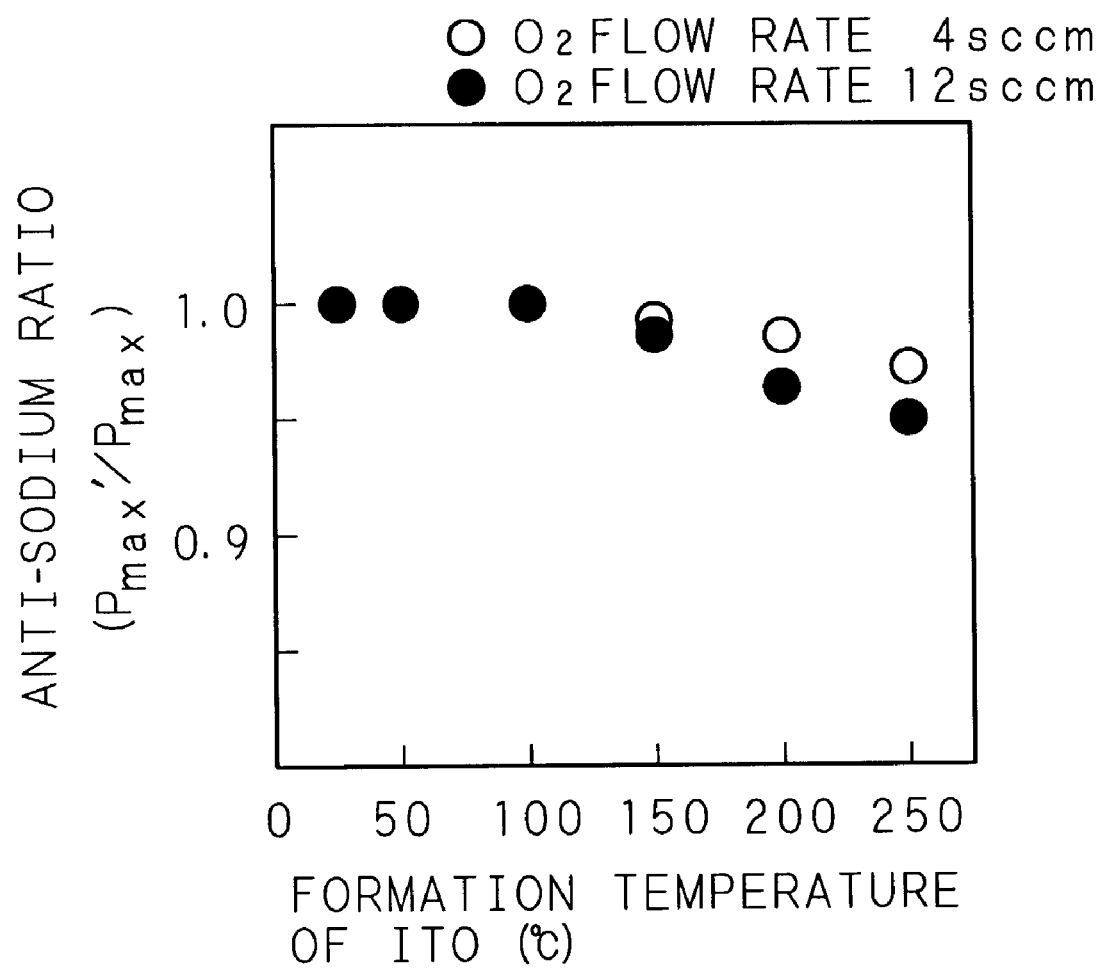
FIG. 16 is a graph showing the relationship between the formation temperature of the ITO film and the anti-sodium ratio when the oxygen flow rate is 4 sccm and 12 sccm.

FIG. 16 is a graph showing the relationship between the formation temperature of the ITO film and the anti-sodium ratio when the oxygen flow rate is 4 sccm and 12 sccm. As shown in FIG. 16, it is confirmed that there is a good correlation between the sodium resistance and a change in the ratio of the (321) diffraction strength to the (222) diffraction strength. Moreover, the outputs obtained by setting the formation temperature of the ITO film at 150° C. and the oxygen flow rate to 4 sccm and 12 sccm were compared. In the condition of 12 sccm, the current increased more, and the output was improved by about 2% due to a high light transmittance of the ITO film. However, when the formation temperature was 150° C. and the oxygen flow rate was 12 sccm, the characteristic decreased by about 1.3% in the sodium resistance test.

Hence, a laminated structure was produced by forming only the boundary layer (10 nm in thickness) at room temperature (25° C.) and the oxygen flow rate of 12 sccm and forming the remaining bulk portion (90 nm in thickness) at 150° C. and the oxygen flow rate of 12 sccm, and the resulting laminated structure was examined. As a result, when this laminated structure was used, no decrease was observed in the characteristic after the sodium resistance test, and it was possible to obtain an output similar to that obtained with the ITO film formed under the conditions of 150° C. and the oxygen flow rate of 12 sccm. Thus, it is confirmed that controlling the crystal orientation in the boundary layer of the ITO film on the surface of the semiconductor layer is extremely effective to satisfy both the output and sodium resistance.

As described above, regarding the ITO film of the photovoltaic element, in the light-incident side ITO film, when the 10 nm-thick boundary layer in contact with the semiconductor layer has an orientation of (321) planes and the bulk layer of the ITO film, excluding the boundary layer, is mainly oriented in the (222) plane, the photovoltaic element has high light transmittance, high efficiency, and high sodium resistance.

Figure 17:
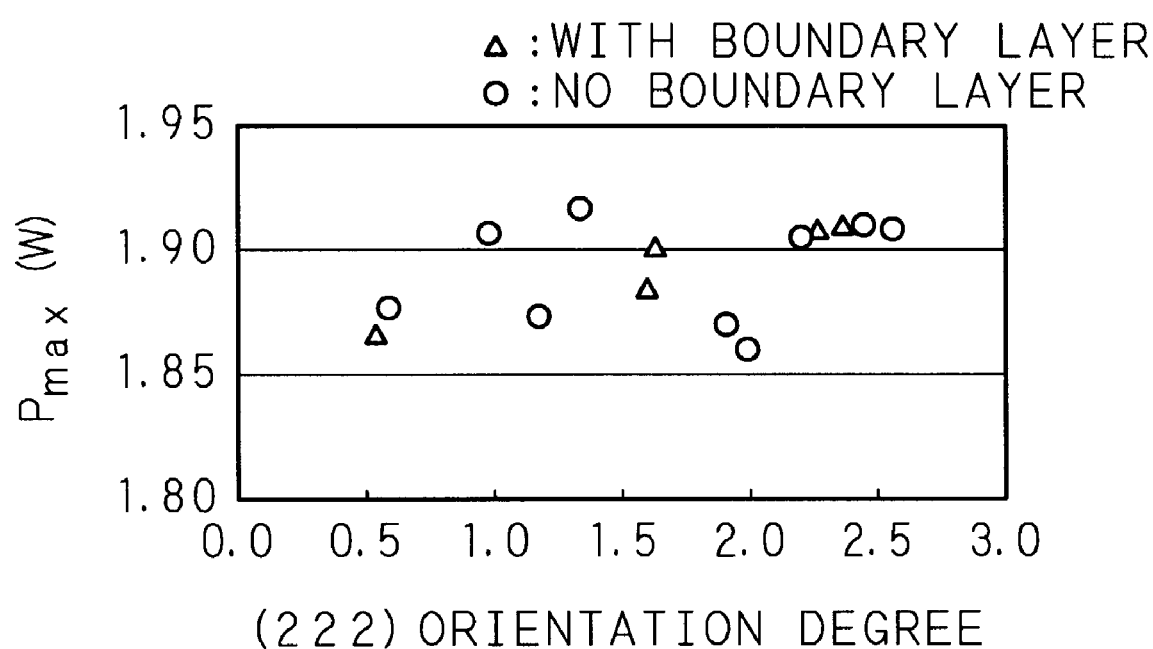
FIG. 17 is a graph showing the relationship between the (222) orientation degree and $P_{max}$.
Figure 18:
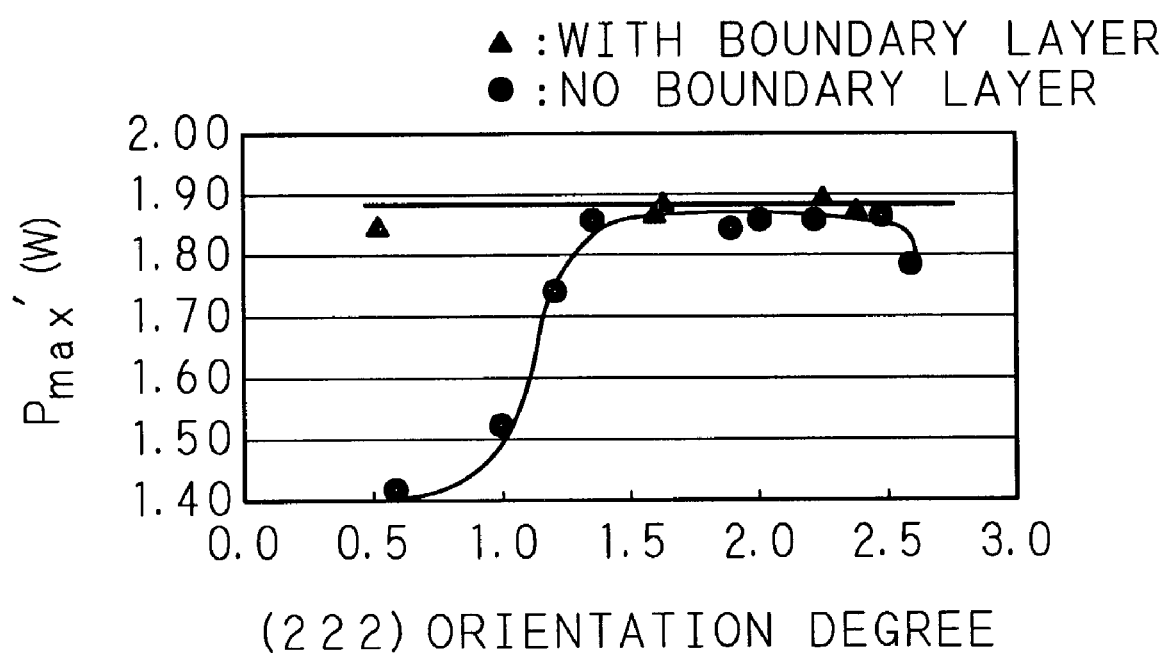
FIG. 18 is a graph showing the relationship between the (222) orientation degree and $P_{max}'$.
Figure 19:
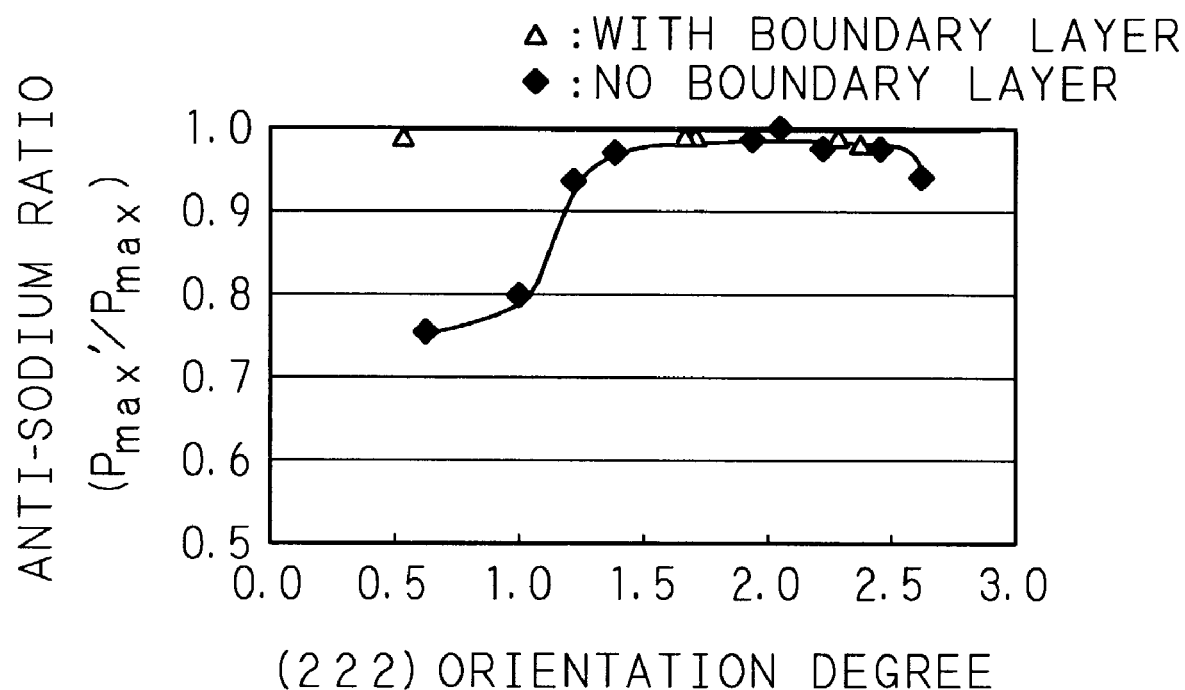
FIG. 19 is a graph showing the relationship between the (222) orientation degree and the anti-sodium ratio.

FIGS. 17 through 19 are graphs showing the relationship between the (222) orientation property and the sodium resistance of the ITO film. FIG. 17 is a graph showing the relationship between the (222) orientation degree and $P_{max}$; FIG. 18 is a graph showing the relationship between the (222) orientation degree and $P_{max}'$; and FIG. 19 is a graph showing the relationship between the (222) orientation degree and the anti-sodium ratio ($P_{max}'/P_{max}$).

It can be understood from the results of FIGS. 18 and 19 that, when the boundary layer having the orientation of (321) planes is not provided, the output $P_{max}'$ after the sodium resistance test decreases and the sodium resistance deteriorates as the (222) orientation degree becomes smaller, while, when the boundary layer having the orientation of (321) planes is provided, the output $P_{max}'$ after the sodium resistance test does not decrease and good sodium resistance is obtained even when the (222) orientation degree becomes smaller.

Figure 20:
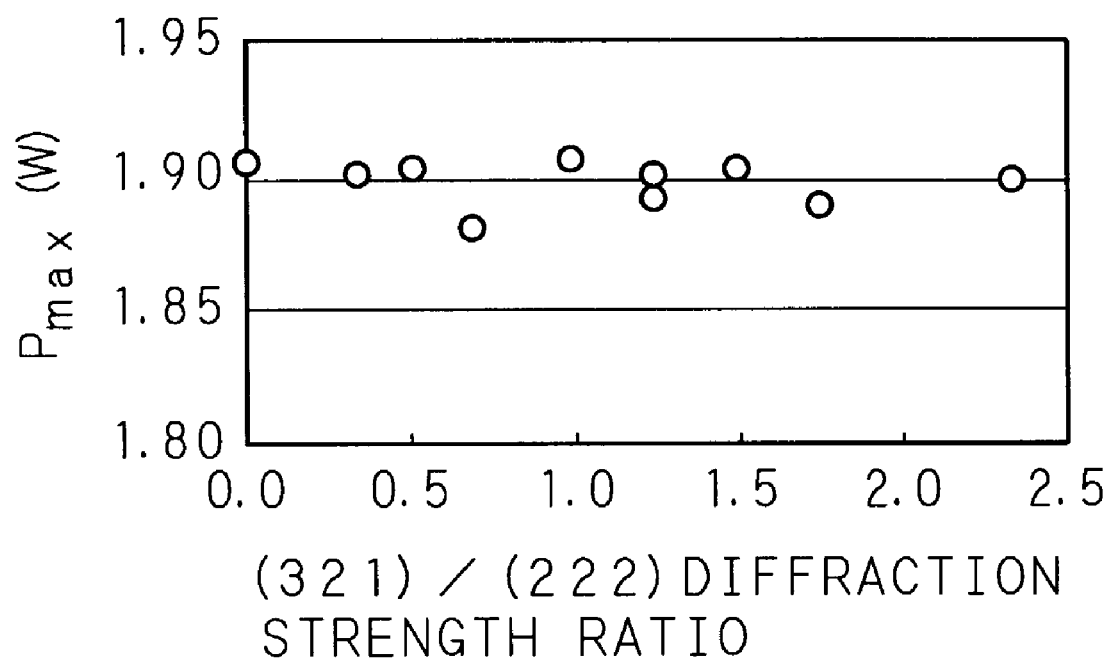
FIG. 20 is a graph showing the relationship between the (321)/(222) diffraction strength ratio in the boundary layer of the ITO film and $P_{max}$.
Figure 21:
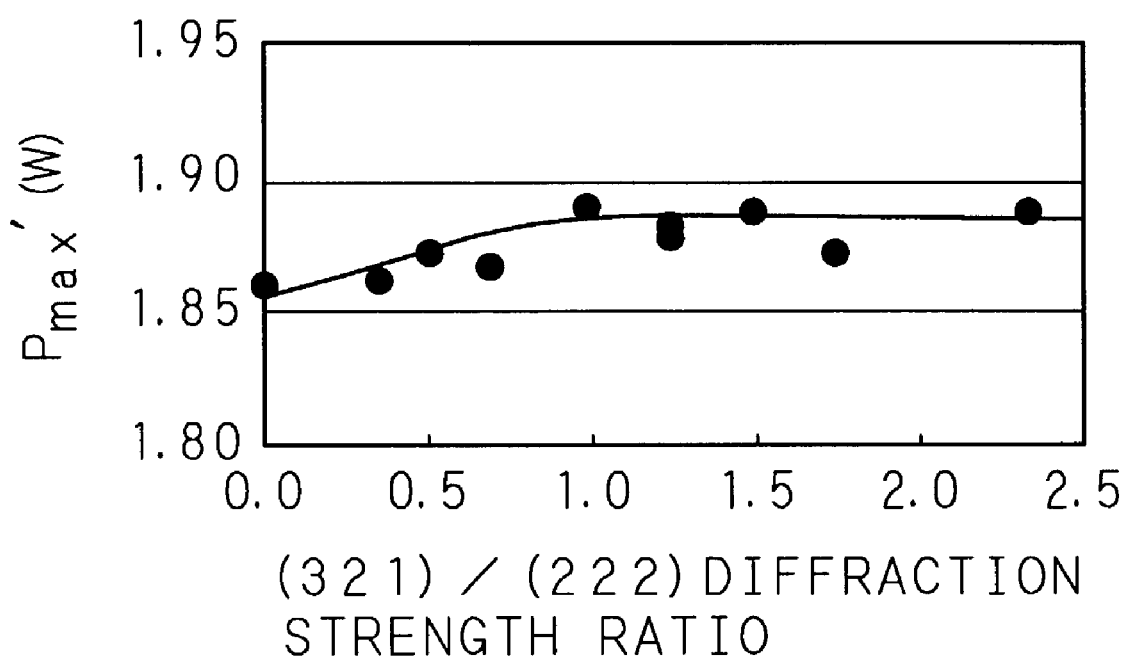
FIG. 21 is a graph showing the relationship between the (321)/(222) diffraction strength ratio in the boundary layer of the ITO film and $P_{max}'$.
Figure 22:
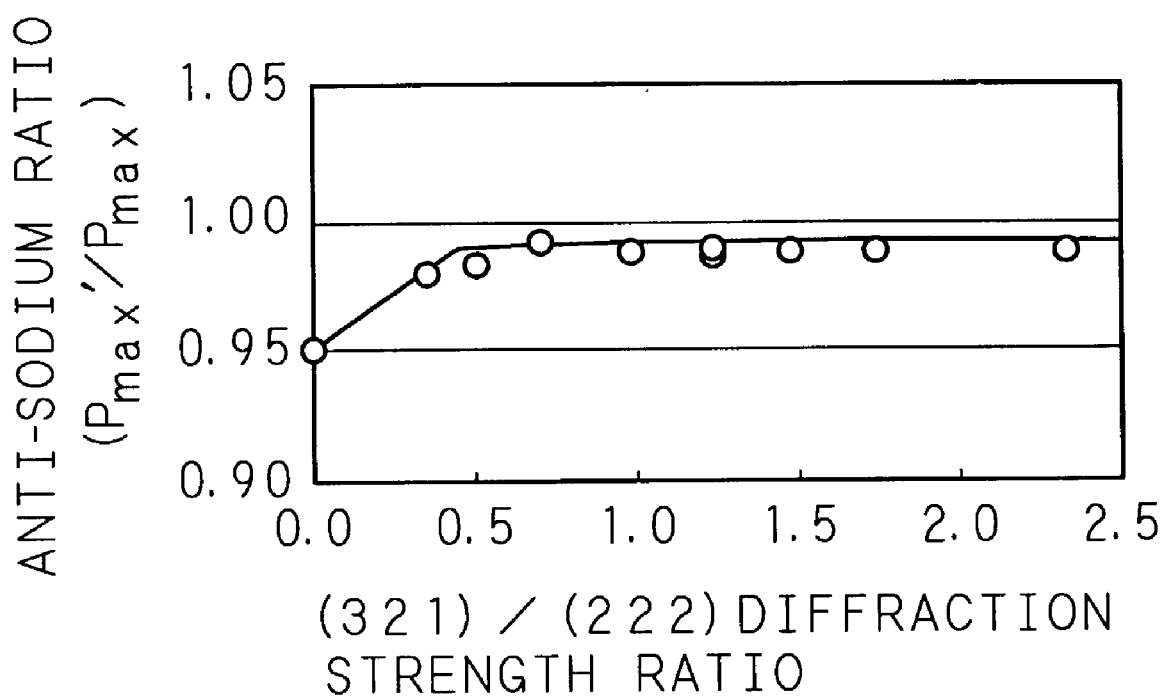
FIG. 22 is a graph showing the relationship between the (321)/(222) diffraction strength ratio in the boundary layer of the ITO film and the anti-sodium ratio.

FIGS. 20 through 22 are graphs showing the relationship between the sodium resistance and the ratio between the (321) diffraction strength and the (222) diffraction strength in the boundary layer of the ITO film. FIG. 20 is a graph showing the relationship between the (321)/(222) diffraction strength ratio and $P_{max}$; FIG. 21 is a graph showing the relationship between the (321)/(222) diffraction strength ratio and $P_{max}'$; and FIG. 22 is a graph showing the relationship between the (321)/(222) diffraction strength ratio and the anti-sodium ratio ($P_{max}'/P_{max}$).

It can be understood from the results of FIG. 22 that a high anti-sodium ratio of not less than 0.98 is obtained when the (321)/(222) strength ratio is not less than 0.5 and not more than 2.5. In addition, it can be understood from the results of FIGS. 21 and 22 that, when the strength ratio (321)/(222) is not less than 1.0 and not more than 2.5, it is possible to provide a photovoltaic element having a high anti-sodium ratio of not less than 0.98 and a high output of not less than 1.88 W after the sodium resistance test.

Note that while the above-described example explains the sodium resistance against sodium diffusion, it is confirmed that the present invention also has advantageous effects against lithium diffusion and potassium diffusion, similar to the effect against sodium diffusion.

Moreover, in the above-described example, the pin junction is formed by stacking the i-type a-Si:H layer and p-type a-Si:H layer on the n-type silicon wafer. However, even if an nip junction of the opposite conductivity type is formed by stacking the i-type a-Si:H layer and n-type a-Si:H layer on the p-type silicon wafer and then the ITO film (transparent conductive film) of the present invention is placed on the n-type a-Si:H layer, it is, of course, possible to provide similar advantageous effects.

Figure 23:
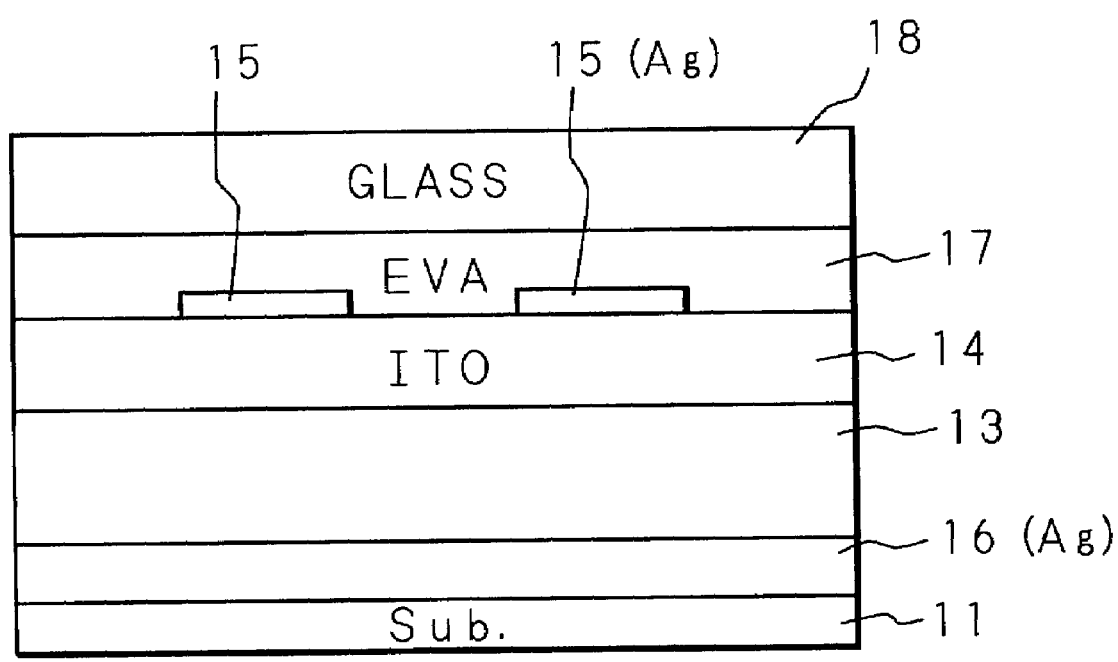
FIG. 23 is a schematic cross sectional view showing another example of a photovoltaic device of the present invention.

The following description will explain the structure of other photovoltaic device to which the present invention is applicable. FIG. 23 is a schematic cross sectional view showing another example of a photovoltaic device of the present invention. In FIG. 23, 11 is a substrate made of a glass plate, a plastic plate, or a metal plate such as Al and SUS with an insulating film such as polyimide and $SiO_2$ formed on the surface thereof. Formed on the substrate 11 is a back electrode 16 made of a metal film such as Ag and Al. Formed on the back electrode 16 is a semiconductor layer 13 which is produced by stacking n-type, i-type and p-type amorphous silicon hydride layers successively.

On the semiconductor layer 13, an ITO film 14 to be a transparent conductive film is formed. Formed on the ITO film 14 is a collecting electrode 15. Furthermore, on the ITO film 14 and the collecting electrode 15, a transparent resin film 17 made of EVA, for example, is provided. Placed on the resin film 17 is a cover glass 18 containing alkaline ions such as Na, Li and K.

The same things as for the ITO film 4 in the previously described photovoltaic device can also be applied to the ITO film (transparent conductive film) 14 in the photovoltaic device having such a structure.

Moreover, while the above-mentioned example explains the case where the ITO film is formed on the amorphous semiconductor layer, the ITO film formed on a microcrystalline semiconductor layer also has similar advantageous effects. Besides, the ITO film of the present invention is also applicable to an amorphous solar cell on which light is incident from the opposite side of the substrate, a microcrystalline solar cell, and a hybrid structure composed of an amorphous solar cell and a microcrystalline solar cell.

As described above, in the present invention, since the transparent conductive film is arranged on an amorphous or microcrystalline semiconductor layer so that the (222) plane orientation degree is not less than 1.0, preferably not less than 1.2 and not more than 2.6, and more preferably not less than 1.4 and not more than 2.5, the transparent conductive film itself has the function of preventing diffusion of alkaline ions from the cover glass. Consequently, it is not necessary to provide a special diffusion preventing layer, and it is possible to prevent diffusion of alkaline ions in an inexpensive manner.

Additionally, in the present invention, since 40% or more of the surface of the transparent conductive film is occupied by regions including small tilt angle grain boundaries, the transparent conductive film itself functions as a diffusion preventing layer against alkaline ions, thereby preventing the diffusion of alkaline ions in a simple manner.

Besides, in the present invention, since the surface roughness of the transparent conductive film is not less than 1.1 and not more than 3.0, it is possible to increase the bond strength of the collecting electrode to the transparent conductive film and ensure long-term reliability.

Moreover, in the present invention, since the sizes of crystal grains contained in the transparent conductive film are between 6 and 100 nm, it is possible to increase the bond strength of the collecting electrode to the transparent conductive film and ensure long-term reliability.

Furthermore, in the present invention, the transparent conductive film has an orientation of (321) planes on the boundary side with respect to the semiconductor layer, and an orientation of (222) planes is dominant in other portion of the transparent conductive film. Hence, the transparent conductive film itself functions as a diffusion preventing layer against alkaline ions, thereby preventing the diffusion of alkaline ions in a simple manner.

Besides, in the present invention, since the ratio of the (321) diffraction strength to the (222) diffraction strength in the 10 nm-thick portion (the boundary layer) on the semiconductor layer side of the transparent conductive film is not less than 0.5 and not more than 2.5, it is possible to achieve extremely good alkali resistance.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A photovoltaic element comprising:
a semiconductor layer comprising an amorphous semiconductor or a microcrystalline semiconductor; and
a transparent conductive film made of an indium oxide film doped with impurities, said transparent conductive film being arranged on a light incident side of said semiconductor layer,
wherein in said transparent conductive film, an orientation of (321) planes is dominant on the boundary side with respect to said semiconductor layer, and an orientation of (222) planes is dominant on a side opposite to said semiconductor layer.

2. The photovoltaic element as set forth in claim 1, wherein said impurities are selected from the group consisting of Sn, Zn, As, Ca, Cu, F, Ge, Mg, S, Si, and Te.

3. The photovoltaic element as set forth in claim 1, wherein, in a 10 nm-thick portion on the semiconductor layer side of said transparent conductive film, a ratio of (321) diffraction strength to (222) diffraction strength measured by X-ray diffraction is not less than 0.5 and not more than 2.5.

4. A photovoltaic device comprising:
a photovoltaic element of claim 1 and
a transparent member containing alkaline ions, arranged on a light incident side of said transparent conductive film.

5. The photovoltaic device as set forth in claim 4, further comprising a resin film arranged on a side opposite to the light incident side of said semiconductor layer.

6. A photovoltaic device comprising:
a first conductivity type silicon wafer;
an intrinsic type first amorphous silicon layer formed on said silicon wafer;
a second conductivity type second amorphous silicon layer formed on said first amorphous silicon layer;
a transparent conductive film made of an indium oxide film doped with impurities, said transparent conductive film being formed on said second amorphous silicon layer;
a collecting electrode formed on said transparent conductive film; and
a transparent member containing alkaline ions, arranged on said collecting electrode and transparent conductive film with a resin layer therebetween,
wherein in said transparent conductive film, an orientation of (321) planes is dominant on the boundary side with respect to said second amorphous silicon layer, and an orientation of (222) planes is dominant on a side opposite to said second amorphous silicon layer.

* * * * *